United States Patent
Kim et al.

(10) Patent No.: US 10,816,852 B2
(45) Date of Patent: Oct. 27, 2020

(54) BACKLIGHT UNIT AND LIQUID CRYSTAL DISPLAY DEVICE INCLUDING THE SAME

(71) Applicant: LG Display Co., Ltd., Seoul (KR)

(72) Inventors: Il-Soo Kim, Paju-si (KR); Dong-Hwi Kim, Paju-si (KR); Ki-Seong Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 62 days.

(21) Appl. No.: 16/170,381

(22) Filed: Oct. 25, 2018

(65) Prior Publication Data
US 2019/0137825 A1    May 9, 2019

(30) Foreign Application Priority Data

Nov. 8, 2017 (KR) .................. 10-2017-0148186

(51) Int. Cl.
| | | |
|---|---|---|
| *G02F 1/1335* | (2006.01) | |
| *G02F 1/13357* | (2006.01) | |
| *H01L 25/13* | (2006.01) | |
| *H05K 1/18* | (2006.01) | |
| *H01L 33/58* | (2010.01) | |
| *H01L 25/075* | (2006.01) | |
| *H05K 1/02* | (2006.01) | |
| *H01L 33/54* | (2010.01) | |

(52) U.S. Cl.
CPC .. *G02F 1/133606* (2013.01); *G02F 1/133603* (2013.01); *H01L 25/0753* (2013.01); *H01L 25/13* (2013.01); *H01L 33/58* (2013.01); *H05K 1/181* (2013.01); *G02F 1/133605* (2013.01); *G02F 2001/133607* (2013.01); *G02F 2001/133614* (2013.01); *H01L 33/54* (2013.01); *H05K 1/0274* (2013.01); *H05K 2201/10106* (2013.01); *H05K 2201/10522* (2013.01); *H05K 2201/2054* (2013.01)

(58) Field of Classification Search
CPC ......... G02F 1/133606; G02F 1/133603; G02F 2001/133607; G02F 1/133605; G02F 2001/133614; H01L 33/54; H01L 25/13; H01L 33/58; H01L 25/0753; H05K 2201/10106; H05K 1/181; H05K 1/0274; H05K 2201/10522; H05K 2201/2054
See application file for complete search history.

(56) References Cited

U.S. PATENT DOCUMENTS

| | | | | |
|---|---|---|---|---|
| 9,041,046 B2* | 5/2015 | Phang | .................. | H01L 33/486 257/99 |
| 2006/0152801 A1* | 7/2006 | Matsunaga | .......... | G02B 5/3033 359/443 |

(Continued)

*Primary Examiner* — Hoan C Nguyen
(74) *Attorney, Agent, or Firm* — Morgan, Lewis & Bockius LLP

(57) ABSTRACT

A backlight unit includes: a plurality of light emitting diode (LED) packages on a top surface of a circuit board; an encapsulation layer located on the circuit board and covering the plurality of LED packages; and an integrated pattern sheet on the encapsulation layer, the integrated pattern sheet including: a base layer; a plurality of lens patterns at a top surface of the base layer and respectively corresponding to the plurality of LED packages; and hollow cavity particles at a bottom surface of the base layer and at a region between the plurality of LED packages.

23 Claims, 6 Drawing Sheets

(56) References Cited

U.S. PATENT DOCUMENTS

| | | | |
|---|---|---|---|
| 2007/0211490 A1* | 9/2007 | Chou | G02F 1/133603 |
| | | | 362/555 |
| 2009/0219509 A1* | 9/2009 | Nomura | G01N 33/54373 |
| | | | 356/39 |
| 2010/0207142 A1* | 8/2010 | Chen | H01L 25/0753 |
| | | | 257/98 |
| 2010/0237365 A1* | 9/2010 | Boonekamp | B32B 17/10761 |
| | | | 257/91 |
| 2012/0120344 A1* | 5/2012 | Kuroda | G02B 5/045 |
| | | | 349/62 |
| 2012/0228646 A1* | 9/2012 | Kuo | H01L 25/0753 |
| | | | 257/88 |
| 2013/0043496 A1* | 2/2013 | Sabathil | H01L 25/0753 |
| | | | 257/88 |
| 2014/0160752 A1* | 6/2014 | Cornelissen | H01L 25/0753 |
| | | | 362/235 |

* cited by examiner

BACKLIGHT UNIT AND LIQUID CRYSTAL DISPLAY DEVICE INCLUDING THE SAME

CROSS REFERENCE TO RELATED APPLICATIONS

The present application claims the priority benefit of Korean Patent Application No. 10-2017-0148186 filed in Republic of Korea on Nov. 8, 2017, which is hereby incorporated by reference in its entirety for all purposes as if fully set forth herein.

BACKGROUND

Technical Field

The present invention relates to a backlight unit and a liquid crystal display device including the same.

Discussion of the Related Art

Facing information society, needs for display devices have increased variously. Recently, flat display devices, such as a liquid crystal display (LCD) device, a plasma display panel (PDP) device, and an organic light emitting diode (OLED) display device, are used.

Among these display devices, LCD devices are widely used because of advantages in a lightweight, a thin profile, a low power consumption and the like. The LCD device includes a liquid crystal panel, and a backlight unit below the liquid crystal panel.

The backlight unit is categorized into a side edge type backlight unit and a direct type backlight unit.

The side edge type backlight unit is configured such that light sources are located at a side of a light guide plate below the liquid crystal panel and a side light from the light sources is converted into a plane light by the light guide plate. However, since the light sources are located at a side of the backlight unit, it is difficult to realize a local dimming of individually driving a plurality of regions into which a backlight unit is divided.

The direct type backlight unit is configured such that a plurality of light sources are arranged directly below the liquid crystal panel and thus supply a light to the liquid crystal panel. The direct type backlight unit improves uniformity and brightness of a light supplied to the liquid crystal panel and realizes a local dimming, and thus reduces a power consumption.

However, since the light sources of the direct type backlight unit supply a light to the liquid crystal panel directly over them, a mura such as a hot spot happens over the light sources and thus a display quality is reduced.

SUMMARY

Accordingly, embodiments of the present invention are directed to a backlight unit and a liquid crystal display device that substantially obviate one or more of the problems due to limitations and disadvantages of the related art.

An object of the present disclosure is to provide a backlight unit and an LCD device including the same that can prevent a mura such as a hot spot thus improve a display quality.

Additional features and aspects will be set forth in the description that follows, and in part will be apparent from the description, or may be learned by practice of the inventive concepts. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a backlight unit comprises a plurality of light emitting diode (LED) packages on a top surface of a circuit board; an encapsulation layer located on the circuit board and covering the plurality of LED packages; and an integrated pattern sheet on the encapsulation layer, the integrated pattern sheet including: a base layer; a plurality of lens patterns at a top surface of the base layer and respectively corresponding to the plurality of LED packages; and hollow cavity particles at a bottom surface of the base layer and at a region between the plurality of LED packages.

In another aspect, a liquid crystal display (LCD) device comprises a liquid crystal panel; and a backlight unit below the liquid crystal panel, the backlight unit including: a plurality of light emitting diode (LED) packages on a top surface of a circuit board; an encapsulation layer located on the circuit board and covering the plurality of LED packages; and an integrated pattern sheet on the encapsulation layer, the integrated pattern sheet including: a base layer; a plurality of lens patterns at a top surface of the base layer and respectively corresponding to the plurality of LED packages; and hollow cavity particles at a bottom surface of the base layer and at a region between the plurality of LED packages.

In another aspect, a backlight unit comprises a plurality of light emitting diode (LED) packages disposed spaced from each other; an integrated pattern sheet over the plurality of LED packages, wherein the integrated pattern sheet includes: a base layer; and a plurality of lens patterns and hollow cavity particles disposed at the base layer, wherein the plurality of lens patterns overlap a region of the plurality of LED packages, and wherein the hollow cavity particles overlap a region between the plurality of LED packages, and do not overlap with each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

First Embodiment

Figure 1:
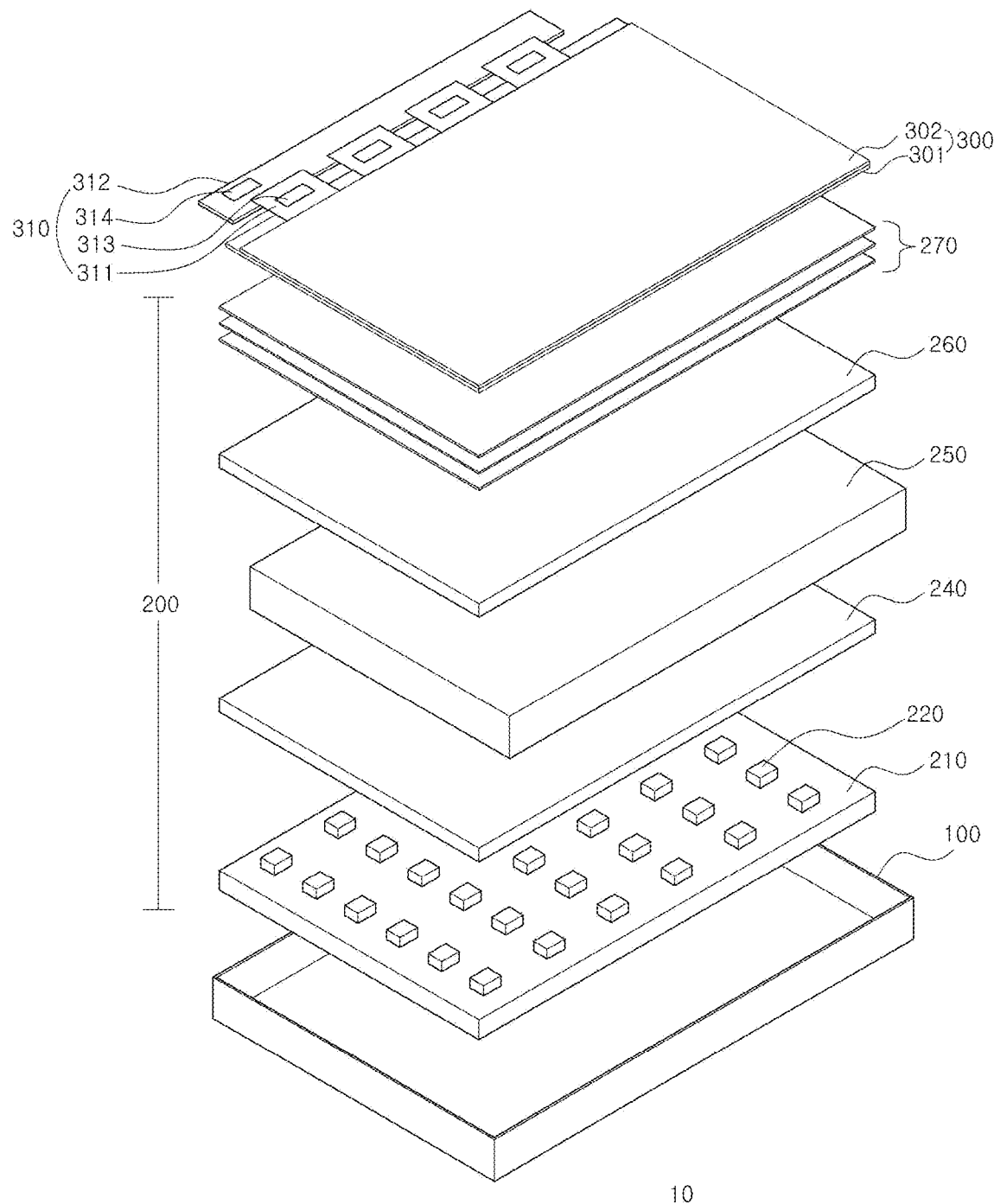
FIGS. 1 and 2 are an exploded perspective view and a cross-sectional view, respectively, schematically illustrating a backlight unit and an LCD device including the same according to a first embodiment of the present invention.
Figure 2:
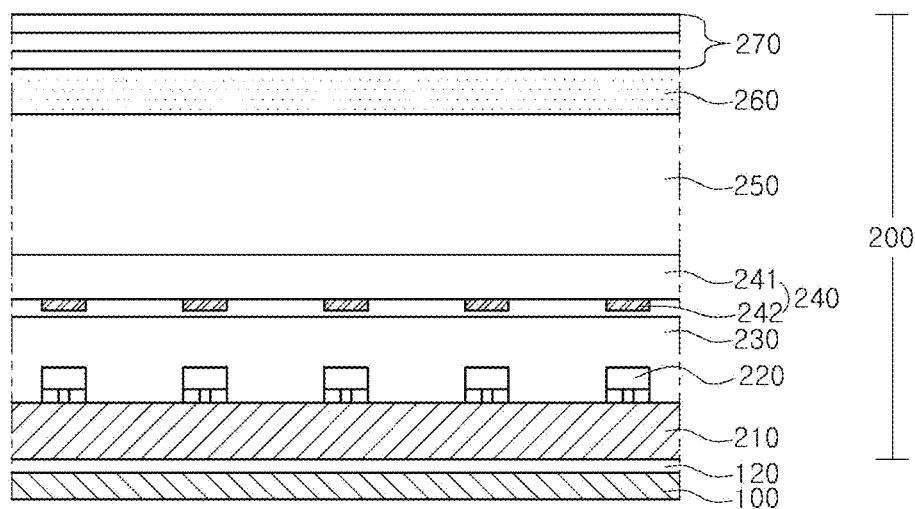

FIGS. 1 and 2 are an exploded perspective view and a cross-sectional view, respectively, schematically illustrating a backlight unit and an LCD device including the same according to a first embodiment of the present invention.

Referring to FIGS. 1 and 2, an LCD device 10 of this embodiment includes a backlight unit 200, a liquid crystal panel 300, a panel driving circuit 310, a bottom cover 100.

The bottom cover 100 is located below, and support, the backlight unit 200. The bottom cover 100 may serve as a component included in the backlight unit 200.

The bottom cover 100 may be formed in a box shape as its top being open to receive the backlight unit 200 inside it. However, the bottom cover 100 may be formed in other configuration, for example, in a plate shape.

Even though not shown in the drawings, the LCD device 10 may include a guide panel that surrounds and supports a side of the backlight unit 200 and the liquid crystal panel 300, and a top cover that covers edges of a top surface of the liquid crystal panel 300.

The backlight unit 200 is a direct type backlight unit, in which a plurality of light sources, for example, light emitting diodes (LEDs) spaced part from each other are arranged below, and face, the liquid crystal panel 300.

The backlight unit 200 may include a circuit board 210, a plurality of LED packages 220, an encapsulation layer (or encapsulation mold) 230, a reflective pattern sheet 240, a diffusion plate 250, a fluorescent sheet 260 and an optical sheet 270.

The circuit board 210 is located on a top surface of the bottom cover 100. The circuit board 210 may be attached to the bottom cover 100 through an adhesive 120 such as a double-sided adhesive tape.

The plurality of LED packages 220 are mounted on a top surface of the circuit board 210. The top surface of the circuit board 210 may have a reflection property, for example, a reflection film may be formed at the top surface of the circuit board 210. In this case, a light is reflected by the circuit board 210 and then travels toward the liquid crystal panel 300.

The LED package 220 emits a light by a driving signal supplied from a backlight driving portion.

The LED package 220 may have various structures. For example, the LED package 220 may have a lateral chip structure, flip chip structure, vertical chip structure, chip scale package (CSP) structure, or the like.

Among the structures, the CSP structure is configured to include an LED chip and a mold enclosing the LED chip, and in this case, a size of the LED package 220 can be minimized and a thickness of the backlight unit 200 can be reduced accordingly.

An encapsulation layer 230 may be located on, and entirely cover, a top surface of the circuit board 210 having the LED packages 220 mounted. The encapsulation layer 230 may be coated at a thickness that is greater than that of the LED package 220 to cover all LED packages 220 mounted on the circuit board 210. The encapsulation layer 230 may serve to stably fix the LED package 220 onto the circuit board 210 and protect the LED package 220 from the outside.

The encapsulation layer 230 may be made of a resin based material including, for example, one or combination of Si, UV resin, PC and PMMA.

The diffusion plate 250 is located on the encapsulation layer 230. The diffusion plate 250 serves to diffuse a light from the LED packages 220 and supply a uniform plane light to the liquid crystal panel 300.

The reflective pattern sheet 240 may be located below the diffusion plate 250 i.e., located on a bottom surface of the diffusion plate 250. The reflective pattern sheet 240 may include a base layer 241, and a plurality of reflective patterns 242 that are formed on a bottom surface of the base layer 241 and are arranged to correspond to the plurality of LED packages 220, respectively.

The reflective pattern 242 serves to reflect, and distribute in a side direction, a part of a light upwardly emitted from the LED package 220 therebelow, and to transmits a remaining part of the light upwardly emitted from the LED package 220. Accordingly, most of the light traveling in an upwardly vertical direction then being incident on the liquid crystal panel 300 can be prevented. Thus, an occurrence of a hot spot caused by a light incidence in a upwardly vertical direction can be prevented, and a reduction of a display quality can be prevented.

The fluorescent sheet 260 may be located on the diffusion plate 250. The diffusion plate 260 may include at least one fluorescent substance that absorbs a part of a light of first color produced by the LED package 220 and makes at least one color that is different from the first color.

In case of using the fluorescent sheet 260, a light of the first color produced by the LED package 220 and a light of the color produced by the fluorescent sheet 260 are mixed to finally form a white light, and the white light is supplied to the liquid crystal panel 300.

For example, when the LED package 220 produces a blue light as the first color light, the fluorescent sheet 260 may absorb a part of the blue light and produce a yellow light as a second color light.

Alternatively, when the LED package 220 produces a white light, the fluorescent sheet 260 may be eliminated.

At least one optical sheet 270 including a light-concentrating sheet may be located on the fluorescent sheet 260. In this embodiment, three optical sheets 270 are shown by way of example.

The liquid crystal panel 300 is located on the backlight unit 200. The liquid crystal panel 300 adjusts a transmissivity of a liquid crystal layer therein to display images. The liquid crystal panel 300 may include a first substrate (or a lower substrate) 301, and a second substrate (or an upper substrate) 302 facing the first substrate 301, and a liquid crystal layer between the first and second substrates 301 and 302.

Even though not shown in the drawings, a first polarization plate and a second polarization plate may be attached to an outer surface of the first substrate 301 and an outer surface of the second substrate 302, respectively.

In the liquid crystal panel 300, a liquid crystal layer of each pixel is operated by an electric field produced by a data voltage and a common voltage applied to each pixel, and according to a transmissivity of the liquid crystal layer, a color image can be displayed.

The panel driving portion 310 may be connected to a pad portion of the first substrate 301 and operate each pixel of the liquid crystal panel 300. For example, the panel driving portion 310 may include a plurality of circuit films 311 connected to the pad portion of the liquid crystal panel 300, a data IC 313 mounted on each circuit film 311, a display printed circuit board 312 connected to the circuit films 311, and a timing control circuit 314 mounted on the display printed circuit board 312.

The timing control circuit 314 may sort and process digital image data input from an external driving system to produce pixel data for respective pixels of the liquid crystal panel 300, in response to timing signals supplied from the external driving system, and supply the pixel data to the data IC 313. Further, the timing control circuit 314 may produce a data control signal and a gate control signal based on the timing signals, and supply the data control signal and the gate control signal to the data IC and a gate IC, respectively.

Further, the timing control circuit 314 may control an emission operation of the backlight unit 200 according to a local dimming method, and individually control a brightness of the liquid crystal panel 300 by region.

In this embodiment, since the backlight unit 200 is a direct type backlight unit, a local dimming to operate the liquid crystal panel by region can be realized, and thus a contrast ratio can be improved and a power consumption can be reduced.

Further, since the reflective pattern sheet 240 including the reflective patterns 241 that are located corresponding to the respective LED packages 220 is used, a light output in a vertical direction is reduced, thus a hot spot can be prevented, and thus a display quality can be improved.

Since a light is reflected by the reflective pattern sheet 240 and traveling to a side direction, an optical gap of the direct type backlight unit 200 can be reduced. Thus, a thickness of the backlight unit 200 can be reduced, and the LCD device 10 in a thin profile can be achieved. Further, because of the reduction of the optical gap, a halo defect that a light in a local dimming region undesirably enters into a neighboring local dimming region can be prevented.

Second Embodiment

Figure 3:
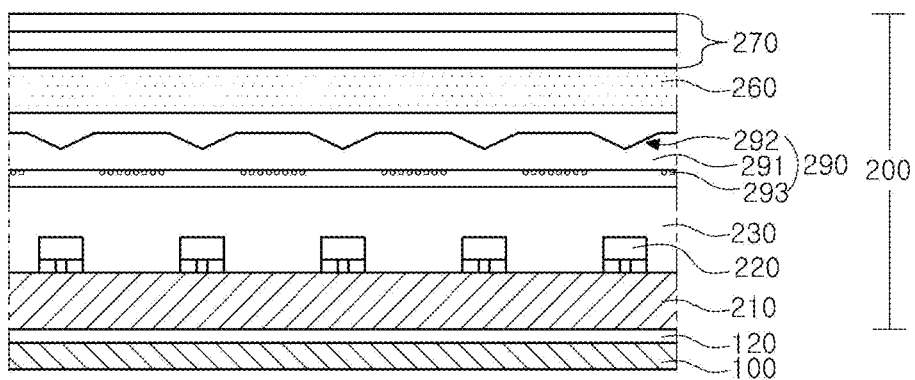
FIG. 3 is a cross-sectional view schematically illustrating a backlight unit and an LCD device including the same according to a second embodiment of the present invention.

FIG. 3 is a cross-sectional view schematically illustrating a backlight unit and an LCD device including the same according to a second embodiment of the present invention.

Explanations of the same or like parts of the first embodiment may be omitted.

Referring to FIG. 3, the backlight unit 200 may include an integrated pattern sheet 290 as a function-integrated single sheet that has (or integrates) functions of the reflective pattern sheet 240 and the diffusion plate 250 of the first embodiment.

The integrated pattern sheet 290 may include a base layer (or base substrate) 291, a plurality of lens patterns 292 formed at one surface e.g., a top surface of the base layer 291, and a plurality of hollow cavity particles 293 attached to the other surface e.g., a bottom surface of the base layer 291.

Each lens pattern 292 may be arranged at the top surface of the integrated pattern sheet 290 corresponding to each LED package 220.

The hollow cavity particles 293 may be arranged at the bottom surface of the integrated pattern sheet 290 corresponding to a region between two neighboring LED packages 220. In other words, the hollow cavity particles 293 may be arranged corresponding to a region between two neighboring lens patterns 292.

Figure 4:
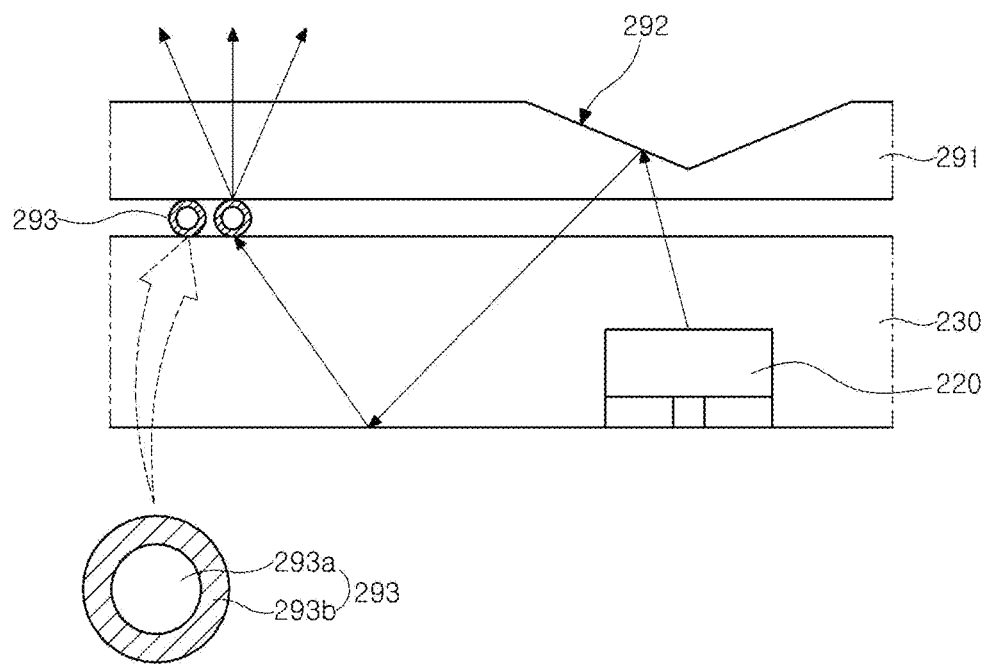
FIG. 4 is a view schematically illustrating a light traveling path through an integrated pattern sheet according to a second embodiment of the present invention.

As such, the hollow cavity particles 293 may be located at a region, where the LED package 220 and the lens pattern 292 are not formed, and thus may not overlap the LED package 220 and the lens pattern 292. In other words, the hollow cavity particles 293 and the lens pattern 292 may be disposed in a stagger state with each other, and disposed on the opposite surface of the integrated pattern sheet 290 respectively Referring further to FIG. 4 illustrating a light traveling path through the integrated pattern sheet 290 of this embodiment, the lens pattern 292 serves like the reflective pattern 242 of the first embodiment. The lens pattern 292 serves to reflect, and turn and distribute in a side or downward direction, at least part of a light upwardly emitted from the LED package 220 therebelow.

In this regard, the lens pattern 292 may have a lens shape, dented downwardly from the top surface of the base layer 291, in a form such that a width thereof decreases along a downward direction and the pattern 292 is symmetrically with respect to a center of the corresponding LED package 220. The lens pattern 292 of this configuration has a total reflection property thus is capable of reflecting a light incident thereon from the LED package 220.

The hollow cavity particles 293 serves to diffuse a light like the diffusion plate 250 of the first embodiment. In this regard, the light reflected by the lens pattern 292 is reflected again on the top surface of the driving circuit 210, is guided through the encapsulation layer 230, and is incident on the hollow cavity particles 293, and the hollow cavity particles 293 scatters the incident light in various directions and outputs the light upwardly.

Thus, a thickness of the backlight unit 200 using the integrated pattern sheet 290 can be greatly reduced, compared with the backlight unit of the first embodiment.

The integrated pattern sheet 290 and the backlight unit including it are explained in more detail.

The base layer 291 of the integrated pattern sheet 290 may be formed in a substantially flat plate type at a uniform thickness. The base layer 291 may be made of, for example, PMMA (poly(methyl methacrylate)), PC (polycarbonate), PS (polystyrene), Si, COC (cyclic olefin copolymer), MS (methyl methacrylate styrene), UV resin, glass or the like.

The lens patterns 292 at the top surface of the base layer 291 are arranged to correspond to the respective LED packages 220. To achieve a total reflection property, the lens pattern 292 may be formed in a depressed form as dented inside the base layer 291.

Since the lens pattern 292 is depressed in the base layer 291, there is an advantage of achieving a reflection property and not increasing a thickness of the integrated pattern sheet 290 as well.

In this regard, in the first embodiment, since the reflective pattern (242 of FIG. 2) is formed on its base layer (241 of FIG. 2), a thickness of the reflective pattern sheet (240 of FIG. 2) increases by a thickness of the reflective pattern. In this embodiment, since the lens pattern 292 of a reflection property is formed inside the base layer 291, a thickness of the integrated pattern sheet 290 can be minimized without increase.

Figure 5A:
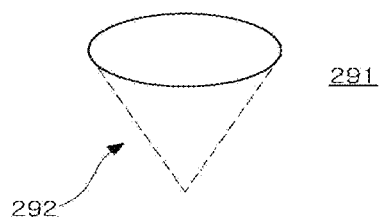
FIG. 5A is a cross-sectional view schematically illustrating a lens pattern in a cone shape according to a second embodiment of the present invention.
Figure 5B:
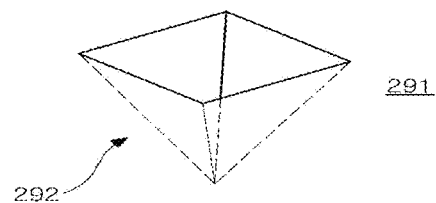
FIG. 5B is a cross-sectional view schematically illustrating a lens pattern in a quadrangular pyramid shape according to a second embodiment of the present invention.
Figure 5C:
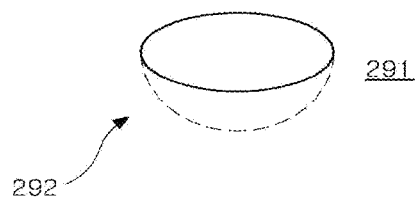
FIG. 5C is a cross-sectional view schematically illustrating a lens pattern in a hemisphere shape according to a second embodiment of the present invention.
Figure 5D:
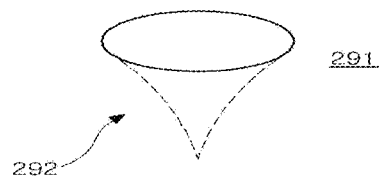
FIG. 5D is a cross-sectional view schematically illustrating a lens pattern in a cone shape having a side surface in an inwardly-dented arc form according to a second embodiment of the present invention.

The lens pattern 292 may have various shapes, which refer to FIGS. 5A to 5D. FIG. 5A shows an example of a lens pattern in a cone shape according to a second embodiment of the present invention, FIG. 5B shows an example of a lens pattern in a quadrangular pyramid shape according to a second embodiment of the present invention, FIG. 5C shows an example of a lens pattern in a hemisphere shape according to a second embodiment of the present invention, and FIG. 5D shows an example of a lens pattern in a cone shape, which has a side surface in an inwardly-dented arc form, according to a second embodiment of the present invention. Other shapes different from those of FIGS. 5A to 5D are applicable to the lens pattern 292.

The hollow cavity particles 293 are located at the bottom surface of the base layer 291. Particularly, the hollow cavity particles 293 are arranged at the bottom surface of the base layer 291 to correspond to a region between the two neighboring LED packages 220 as not overlapping the LED packages 220.

In other words, the hollow cavity particles 293 are arranged at the bottom surface of the base layer 291 to correspond to a region between the two neighboring lens patterns 292 as not overlapping the lens patterns 292.

According to this arrangement, the lens pattern 292 is substantially arranged at a region correspond to the LED package 220 and is not arranged at a region between the LED packages 220, and the hollow cavity particles 293 is not arranged at a region over the LED package 220 and is arranged at a region between the LED packages 220.

By this arrangement of the hollow cavity particles 293, a light that is reflected by the lens pattern 292 and then is incident on the hollow cavity particles 293 through a reflection by the circuit board 210 or the like is scattered by the hollow cavity particles 293 and is distributed in various upward directions. Thus, an effect of an overall uniform light distribution can be achieved.

In this regard, in a case that the hollow cavity particles 293 are located even below the lens pattern 292, a light emitted from the LED package 220 is first scattered by the hollow cavity particles 293 thus changes in path. In this case, due to the change of light path, an incident angle on the lens pattern 292 changes, thus an amount of a light that is not reflected by the lens pattern 292 but is transmitted upwardly increases, and thus a bright point defect such as a hot spot is not solved but happens.

Accordingly, this embodiment employs a structure that the hollow cavity particles 293 are not located below the lens pattern 292 i.e., over the LED package 220, and thus can have an advantage of improving a hot spot and obtaining a diffusion property.

Further, by using the hollow cavity particle 293 that has an hollow cavity 293a of a air space therein, a scattering property is maximized thus a diffusion property can be maximized, compared with a case of using a particle, referred to as a bead or solid particle, that is formed solid without an air space therein.

In this regard, in the case of using the bead formed solid without an air space therein, a light incident on the bead is refracted twice. Compared with this case, when using the hollow cavity particle 293 of this embodiment, a light incident on the bead is refracted four times. Accordingly, when using the hollow cavity particle 293, a number of light refraction increases, thus a scattering property increases greatly, and thus an advantage of significantly increasing a diffusion property can be achieved.

The hollow cavity particle 293 is a sphere-shaped particle, and includes the hollow cavity 293a inside it and a shell 293b enclosing the hollow cavity 293a. The shell 293b may be made of a material that has a refractive index different from, preferably has a refractive index greater than, a refractive index of the air filling the hollow cavity 293a. For example, the shell 293b may have a refractive index of about 1.4 to about 1.6, and may be formed of a material such as $SiO_2$, $TiO_2$ or the like.

Since the integrated pattern sheet 290 includes the lens pattern 292 and the hollow cavity particles 293, the backlight unit 200 using the integrated pattern sheet 290 of this embodiment can have substantially the same optical property as the backlight unit using the reflective pattern sheet 240 and the diffusion plate 250 of the first embodiment.

Figure 6:
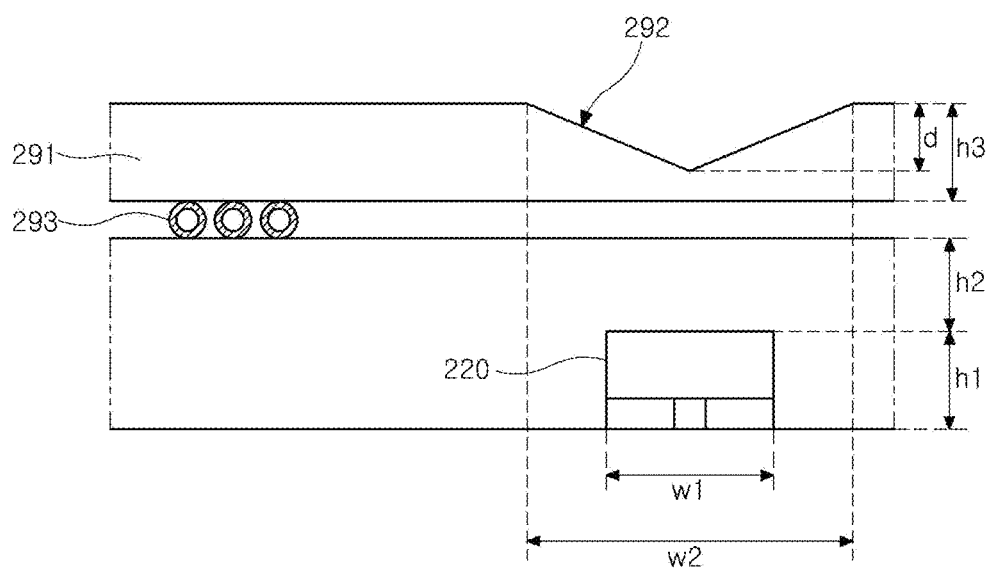
FIG. 6 is a cross-sectional view illustrating a relation of an LED package, an encapsulation layer and an integrated pattern sheet according to a second embodiment of the present invention.

When using the integrated pattern sheet 290, to secure an optical property, it is preferable that the LED package 220, the encapsulation layer 230 and the integrated pattern sheet 290 are configured as following relational expressions. This is explained with reference to FIG. 6.

$$w2/w1=1.5\sim2.5. \qquad \text{Relational expression 1}$$

$$h2/h1=0.8\sim1.2. \qquad \text{Relational expression 2}$$

$$d/h3=0.4\sim0.6. \qquad \text{Relational expression 3}$$

In the expressions, 'w1' is a width (or size) of the LED package 220, 'w2' is a width (or size) of the lens pattern 292, 'h1' is a height (or thickness) of the LED package 220, 'h2' is a height (or thickness) of a part of the encapsulation layer 230 on the LED package 220, 'h3' is a height (or thickness) of the base layer 291 of the integrated pattern sheet 290, and 'd' is a depth (or height or thickness) of the lens pattern 292.

When at least one of the relational expressions 1 to 3 is satisfied, a uniform light distribution can be achieved. As a number of the relational expressions 1 to 3 satisfied increases, a light distribution property rises.

The relational expression 1 between the LED package 220 and the lens pattern 292, and when the numerical range set by this expression is not satisfied, a bright point defect or dark point defect may happen.

This is explained with reference to FIGS. 7 to 9, which respectively shows simulation results of comparative examples and this embodiment.

Figure 7:
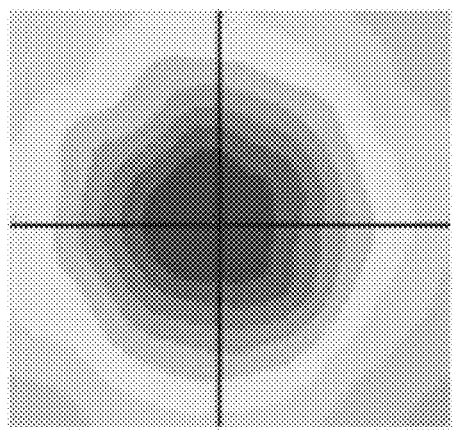
FIGS. 7 to 9 are views respectively illustrating simulation results of light distributions according to comparative examples 1 and 2 and a second embodiment of the present invention.

As shown in FIG. 7, in a first comparative example where w2/w1 is less than a lowest value, 1.5, of the range of the relational expression 1, a bright point defect may happen in some harsh environment.

Figure 8:
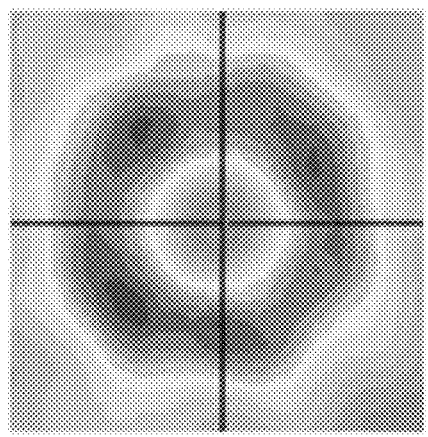

As shown in FIG. 8, in a second comparative example where w2/w1 is greater than a highest value, 2.5, of the range of the relational expression 1, a dark point defect may happen in some harsh environment.

Figure 9:
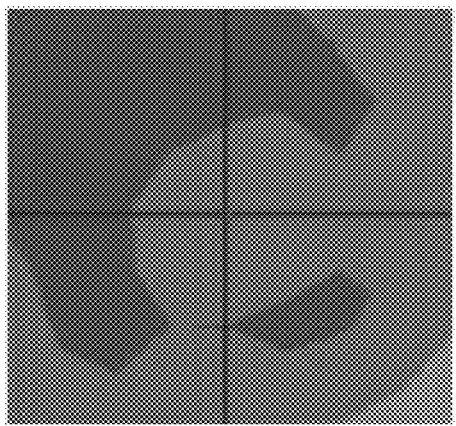

As shown in FIG. 9, in this embodiment where w2/w1 is in the range, 1.5~2.5 of the relational expression 1, a uniform light distribution can be achieved substantially without bright point defect and dark point defect even if the display works for a long time.

Similarly, when the relational expression 2 or the relational expression 3 is not satisfied, a bright point defect or dark point defect may happen in some harsh environment.

As described above, in this embodiment, by using the integrated pattern sheet 290, a thickness of the backlight unit 200 can be reduced, and further, a uniform light distribution without a hot spot can be achieved thus a display quality can be improved. Therefore, an ultra thin LCD device displaying a high quality image can be effectively realized.

This reduction of the thickness of the LCD device is explained with reference to Tables 1 and 2. Tables 1 and 2 respectively show thicknesses of the LCD devices according to the first and second embodiments of the present invention. Particularly, in Tables 1 and 2, the thicknesses, except for thicknesses of the liquid crystal panels, of the LCD devices of the first and second embodiments are written.

TABLE 1

| Components | Thickness [mm] |
|---|---|
| Optical sheets (270) (3 sheets) | 0.4 |
|  | 0.155 |
|  | 0.12 |
| Fluorescent sheet (260) | 0.13 |
| Diffusion plate (250) | 1.5 |
| Reflective pattern sheet (240) | 0.15 |
| Encapsulation layer (230) | 0.5 |
| LED package (220) | — |
| Circuit board (210) | 0.37 |
| Adhesive (120) | 0.1 |
| Bottom cover (100) | 0.4 |
| Total | 3.83 (100%) |

TABLE 2

| Components | | Thickness [mm] |
|---|---|---|
| Optical sheets (270) (3 sheets) | | 0.4 |
| | | 0.155 |
| | | 0.12 |
| Fluorescent sheet (260) | | 0.13 |
| Integrated pattern sheet (290) | Lens pattern (292) | — |
| | Base layer (291) | 0.15 |
| | Hollow cavity particle (293) | 0.02 |
| Encapsulation layer (230) | | 0.5 |
| LED package (220) | | — |
| Circuit board (210) | | 0.37 |
| Adhesive (120) | | 0.1 |
| Bottom cover (100) | | 0.4 |
| Total | | 2.34 (61%) |

Referring to Table 1, in the first embodiment, the reflective pattern sheet 240 has a thickness of 0.15 mm, the diffusion plate 250 has a thickness of 1.5 mm, and the LCD device has a thickness of 3.83 mm, except for a thickness of a liquid crystal panel.

Referring to Table 2, in the second embodiment, the integrated pattern sheet 290 has a thickness of 0.17 mm. In other words, the base layer 291 has a thickness of 0.15 mm, and the hollow cavity particle 293 has a thickness of 0.02 mm. The LCD device including this component has a thickness of 2.34 mm, except for a thickness of a liquid crystal panel. In this case, the lens pattern 292 is formed inside the base layer 291 thus is not applied to the calculation of thickness.

As such, in the second embodiment, the integrated pattern sheet 290 has the thickness, 0.17 mm, as being reduced remarkably compared with the thickness, 1.65 mm (i.e., 0.15 mm+1.5 mm), of the reflective pattern sheet 240 and the diffusion plate 250 of the first embodiment which correspond to the integrated pattern sheet 290. Accordingly, a total thickness, 2.34 mm, of the second embodiment is about 61% of a total thickness, 3.83 mm, of the first embodiment, and the backlight unit and the LCD device of the second embodiment can be reduced greatly.

As such, according to the second embodiment, ultra thin backlight unit and LCD device with substantially the same optical property as the first embodiment can be realized.

As described above, according to the embodiments of the present invention, the pattern of a reflection property e.g., the reflective pattern or lens pattern is located on the LED package, and the diffusion plate is located on the LED package or the hollow cavity particles are located between the LED packages. Accordingly, an output of a light traveling upwardly over the LED package can be reduced and an optical gap can be reduced. Thus, a mura such as a hot spot can be prevented thus a display quality can be improved, and the backlight unit and the LCD device in thin profile can be realized.

Further, when the single integrated pattern sheet including the lens pattern and the hollow cavity particles is used, an optical property can be maintained and a thickness can be reduced greatly. Thus, ultra thin backlight unit and LCD device with a high display quality can be realized.

It will be apparent to those skilled in the art that various modifications and variation can be made in the backlight unit and the liquid crystal display device including the same of the present disclosure without departing from the technical idea or scope of the disclosure. Thus, it is intended that the present invention cover the modifications and variations of this disclosure provided they come within the scope of the appended claims and their equivalents.

What is claimed is:

1. A backlight unit, comprising:
a plurality of light emitting diode (LED) packages on a top surface of a circuit board;
an encapsulation layer located on the circuit board and covering the plurality of LED packages; and
an integrated pattern sheet on the encapsulation layer, the integrated pattern sheet including:
a base layer;
a plurality of lens patterns at a top surface of the base layer and respectively corresponding to the plurality of LED packages; and
hollow cavity particles at a bottom surface of the base layer and at a region between the plurality of LED packages,
wherein the hollow cavity particle includes a hollow cavity of an air space and a shell enclosing the hollow cavity, and
wherein the hollow cavity particles are in an air gap between the bottom surface of the base layer and a top surface of the encapsulation layer, and directly contact the bottom surface of the base layer and the top surface of the encapsulation layer.

2. The backlight unit of claim 1, wherein the plurality of lens patterns do not overlap the hollow cavity particles.

3. The backlight unit of claim 1, wherein a width ($w_1$) of the LED package and a width (w2) of the lens pattern have a ratio, w2/w1 of 1.5~2.5.

4. The backlight unit of claim 1, wherein a height (h1) of the LED package and a height (h2) of a part of the encapsulation layer on the LED package have a ratio, h2/h1 of 0.8~1.2.

5. The backlight unit of claim 1, a height (h3) of the base layer and a depth (d) of the lens pattern have a ratio, d/h3 of 0.4~0.6.

6. The backlight unit of claim 1, wherein the lens pattern has a cone shape, quadrangular pyramid shape or hemisphere shape.

7. The backlight unit of claim 1, further comprising a fluorescent sheet on the integrated pattern sheet.

8. The backlight unit of claim 1, wherein the base layer has a single-layered structure, and wherein the lens pattern has a lens shape dented downwardly from the top surface of the base layer.

9. A liquid crystal display (LCD) device, comprising:
a liquid crystal panel; and
a backlight unit below the liquid crystal panel,
the backlight unit including:
a plurality of light emitting diode (LED) packages on a top surface of a circuit board;
an encapsulation layer located on the circuit board and covering the plurality of LED packages; and
an integrated pattern sheet on the encapsulation layer, the integrated pattern sheet including:
a base layer;
a plurality of lens patterns at a top surface of the base layer and respectively corresponding to the plurality of LED packages; and
hollow cavity particles at a bottom surface of the base layer and at a region between the plurality of LED packages,
wherein the hollow cavity particle includes a hollow cavity of an air space and a shell enclosing the hollow cavity, and
wherein the hollow cavity particles are in an air gap between the bottom surface of the base layer and a top surface of the encapsulation layer, and directly contact the bottom surface of the base layer and the top surface of the encapsulation layer.

10. The LCD device of claim 9, wherein the plurality of lens patterns do not overlap the hollow cavity particles.

11. The LCD device of claim 9, wherein a width (w1) of the LED package and a width (w2) of the lens pattern have a ratio, w2/w1 of 1.5~2.5.

12. The LCD device of claim 9, wherein a height (h1) of the LED package and a height (h2) of a part of the encapsulation layer on the LED package have a ratio, h2/h1 of 0.8~1.2.

13. The LCD device of claim 9, a height (h3) of the base layer and a depth (d) of the lens pattern have a ratio, d/h3 of 0.4~0.6.

14. The LCD device of claim 9, wherein the lens pattern has a cone shape, quadrangular pyramid shape or hemisphere shape.

15. The LCD device of claim 9, wherein the backlight unit further includes a fluorescent sheet on the integrated pattern sheet.

16. The LCD device of claim 9, wherein the base layer has a single-layered structure, and wherein the lens pattern has a lens shape dented downwardly from the top surface of the base layer.

17. A backlight unit comprising:
a plurality of light emitting diode (LED) packages disposed spaced from each other;
an encapsulation layer on the plurality of LED packages; and
an integrated pattern sheet over the plurality of LED packages and the encapsulation layer, wherein the integrated pattern sheet includes:
a base layer; and
a plurality of lens patterns and hollow cavity particles disposed at the base layer,
wherein the plurality of lens patterns overlap a region of the plurality of LED packages,
wherein the hollow cavity particles overlap a region between the plurality of LED packages, and do not overlap with each other, and
wherein the hollow cavity particle includes a hollow cavity of an air space and a shell enclosing the hollow cavity, and wherein the hollow cavity particles are in an air gap between a bottom surface of the base layer and a top surface of the encapsulation layer, and directly contact the bottom surface of the base layer and the top surface of the encapsulation layer.

18. The backlight unit of claim 17, wherein the encapsulation layer covers the plurality of LED packages,
wherein the plurality of lens patterns are at a top surface of the base layer and respectively correspond to the plurality of LED packages.

19. The backlight unit of claim 17, wherein a width (w1) of the LED package and a width (w2) of the lens pattern have a ratio, w2/w1 of 1.5~2.5.

20. The backlight unit of claim 17, a height (h3) of the base layer and a depth (d) of the lens pattern have a ratio, d/h3 of 0.4~0.6.

21. The backlight unit of claim 17, wherein the lens pattern has a cone shape, quadrangular pyramid shape or hemisphere shape.

22. The backlight unit of claim 17, further comprising a fluorescent sheet on the integrated pattern sheet.

23. The backlight unit of claim 17, wherein the base layer has a single-layered structure, and wherein the lens pattern has a lens shape dented downwardly from a top surface of the base layer.

* * * * *